(12) United States Patent
Ban et al.

(10) Patent No.: US 11,171,304 B2
(45) Date of Patent: Nov. 9, 2021

(54) FLEXIBLE SUBSTRATE, PREPARATION METHOD THEREOF, AND DISPLAY DEVICE

(71) Applicant: BOE Technology Group Co., Ltd., Beijing (CN)

(72) Inventors: Shengguang Ban, Beijing (CN); Zhanfeng Cao, Beijing (CN); Ke Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/766,849

(22) PCT Filed: Dec. 13, 2019

(86) PCT No.: PCT/CN2019/125376
§ 371 (c)(1),
(2) Date: May 26, 2020

(87) PCT Pub. No.: WO2020/143396
PCT Pub. Date: Jul. 16, 2020

(65) Prior Publication Data
US 2021/0226154 A1    Jul. 22, 2021

(30) Foreign Application Priority Data

Jan. 10, 2019    (CN) .......................... 201910023365.9

(51) Int. Cl.
*H01L 51/56*    (2006.01)
*H01L 51/52*    (2006.01)
(Continued)

(52) U.S. Cl.
CPC ...... *H01L 51/5225* (2013.01); *H01L 27/3258* (2013.01); *H01L 27/3276* (2013.01);
(Continued)

(58) Field of Classification Search
CPC .. H01L 51/56; H01L 51/5225; H01L 51/5215
See application file for complete search history.

(56) References Cited

U.S. PATENT DOCUMENTS

2014/0183483 A1    7/2014    Kim et al.
2019/0333972 A1    10/2019    Ding et al.

FOREIGN PATENT DOCUMENTS

| CN | 108666347 A | 10/2018 |
|----|-------------|---------|
| CN | 109742121 A | 5/2019 |
| CN | 209087845 A | 7/2019 |

*Primary Examiner* — Douglas M Menz
(74) *Attorney, Agent, or Firm* — Arent Fox LLP; Michael Fainberg

(57) ABSTRACT

Disclosed are a flexible substrate, a preparation method thereof, and a display device, to improve the encapsulation effect and the product yield. The flexible substrate includes: a base substrate, where the base substrate has a plurality of sub-pixel areas arranged in an array, connection areas each for connecting adjacent sub-pixel areas; and hollow areas among the sub-pixel areas and the connection area; in each sub-pixel area, there are a pixel circuit, an isolation structure surrounding the pixel circuit, and a light-emitting functional layer covering the pixel circuit and the isolation structure; the isolation structure has a hollow pattern at a junction of the sub-pixel area and the connection area; the connection area has a signal line therein, and the signal line is electrically connected with the pixel circuit through the hollow pattern; and the isolation structure has an undercut that interrupts the light-emitting functional layer.

15 Claims, 4 Drawing Sheets

(51) Int. Cl.
*H01L 27/32* (2006.01)
*H01L 51/00* (2006.01)

(52) U.S. Cl.
CPC ...... *H01L 51/0097* (2013.01); *H01L 51/5215* (2013.01); *H01L 51/56* (2013.01); *H01L 2227/323* (2013.01); *H01L 2251/5338* (2013.01)

FLEXIBLE SUBSTRATE, PREPARATION METHOD THEREOF, AND DISPLAY DEVICE

CROSS REFERENCE TO RELATED APPLICATION

This application is a US National Stage of International Application No. PCT/CN2019/125376, filed on Dec. 13, 2019, which claims the priority of Chinese Patent Application No. 201910023365.9, filed with the Chinese Patent Office on Jan. 10, 2019, and entitled "Flexible Substrate, Preparation Method thereof, and Display Device", which is hereby incorporated by reference in its entirety.

FIELD

The present application relates to the field of display technology, and in particular, to a flexible substrate, a preparation method thereof, and a display device.

BACKGROUND

With the development of organic light-emitting diode (OLED) display technology, OLEDs have changed from general flat panel rigid display, bendable display to the currently developing flexible display. Such development greatly contributes to the diversification of display. However, the general OLED flexible display can only be bended in two-dimensions, which cannot achieve flexible display in complicated wearable and other extreme situations. As such, there is a need to find a solution to achieve flexible display of a display panel in a third dimension, i.e. to develop a stretchable OLED display. In an existing stretchable OLED display solution, a polyimide (PI) substrate is bored, islands and bridges are formed on the PI substrate, a pixel area is formed in an island area, and traces are prepared in the bridge area. The bridges on the PI substrate may allow deformation during stretching. In summary, to ensure the stretching property of a stretchable OLED display product in the prior art, each pixel needs to be bored, which increases the water vapor invading paths, and affects the packaging effect and the product yield.

SUMMARY

Embodiments of the present disclosure provide a flexible substrate, a preparation method thereof, and a display device, to improve the packaging effect and the product yield.

A flexible substrate provided in an embodiment of the present application includes a base substrate, where the base substrate has a plurality of sub-pixel areas arranged in an array, and connection areas between the sub-pixel areas, each for connecting adjacent sub-pixel areas; and hollow areas are provided on the base substrate between the sub-pixel areas except for the connection area; in each sub-pixel area, there are a pixel circuit, an isolation structure surrounding the pixel circuit, and a light-emitting functional layer covering the pixel circuit and the isolation structure; the isolation structure has a hollow pattern at a junction of the sub-pixel area and the connection area; the connection area has a signal line therein, and the signal line is electrically connected with the pixel circuit through the hollow pattern; and the isolation structure has an undercut that interrupts the light-emitting functional layer.

In some embodiments, the undercut includes: a first undercut on a side of the isolation structure facing the pixel circuit, and/or a second undercut on a side of the isolation structure facing away from the pixel circuit.

In some embodiments, the isolation structure includes a plurality of film layers disposed in stack, where the width of at least part of an intermediate film layer is smaller than that of an upper film layer.

In some embodiments, the isolation structure includes a successively stacked multi-layer metal layer and a transparent conductive layer, where the width of an intermediate layer of the multi-layer metal layer is the smallest.

In some embodiments, the multi-layer metal layer is disposed in the same layer as a source and a drain of a thin film transistor in the pixel circuit, and the transparent conductive layer is disposed in the same layer as an anode in the pixel circuit.

In some embodiments, the multi-layer metal layer is a titanium/aluminum/titanium stacked layer.

In some embodiments, the transparent conductive layer is an indium tin oxide/silver/indium tin oxide stacked layer.

In some embodiments, the light-emitting functional layer includes a light-emitting layer and a cathode disposed on the light-emitting layer, and the undercut interrupts the cathode.

In some embodiments, the material of the cathode is a magnesium-silver alloy.

A preparation method of a flexible substrate provided in an embodiment of the present application includes: providing a base substrate, where the base substrate is divided into a plurality of sub-pixel areas arranged in an array, and connection areas between the sub-pixel areas, each for connecting adjacent sub-pixel areas; and hollow areas are provided on the base substrate between the sub-pixel areas except for the connection area; forming a pixel circuit and an isolation structure surrounding the pixel circuit in each of the sub-pixel areas, and forming signal lines connecting the pixel circuits in the connection area; and forming a light-emitting functional layer covering the pixel circuit and the isolation structure, where the isolation structure has a hollow pattern at a junction of the sub-pixel area and the connection area; the signal line provided in the connection area is electrically connected with the pixel circuit through the hollow pattern; and the isolation structure has an undercut that interrupts the light-emitting functional layer.

In some embodiments, forming a pixel circuit and an isolation structure surrounding the pixel circuit in each of the sub-pixel areas specifically includes: forming film layers of a thin film transistor successively on the base substrate, where a multi-layer metal layer covering an encapsulation area is formed at the same time as the formation of a source and drain metal layer of the thin film transistor; forming an anode layer on the thin film transistor and the multi-layer metal layer, forming a pattern of an anode on the thin film transistor and forming a pattern of a transparent conductive layer on the multi-layer metal layer, by using a patterning process; forming a pattern of a multi-layer metal layer by using a patterning process, where on the base substrate, a projection of the pattern of the transparent conductive layer coincides with a projection of the pattern of the multi-layer metal layer; and forming an undercut on a side of the multi-layer metal layer facing the pixel circuit, and/or on a side of the multi-layer metal layer facing away from the pixel circuit.

In some embodiments, forming a pattern of an anode on the thin film transistor and forming a pattern of a transparent conductive layer on the multi-layer metal layer by using a patterning process specifically includes: forming a pattern of an anode on the thin film transistor and forming a pattern of a transparent conductive layer on the multi-layer metal layer by using a wet etching process; and forming a pattern of a multi-layer metal layer by using a patterning process specifically includes: forming a pattern of a multi-layer metal layer by using a dry etching process.

In some embodiments, forming an undercut on a side of the multi-layer metal layer facing the pixel circuit, and/or on a side of the multi-layer metal layer facing away from the pixel circuit specifically includes: etching an intermediate layer of the multi-layer metal layer by a wet etching process, to form an undercut on a side of the multi-layer metal layer facing the pixel circuit, and/or on a side of the multi-layer metal layer facing away from the pixel circuit.

In some embodiments, the light-emitting functional layer includes a light-emitting layer and a cathode located above the light-emitting layer; and forming a light-emitting functional layer covering the pixel circuit and the isolation structure specifically includes: forming a light-emitting layer on the pixel circuit; and forming a cathode covering the light-emitting layer and the isolation structure, where the undercut interrupts the cathode.

A display device provided in an embodiment of the present application includes the above-mentioned flexible substrate provided in an embodiment of the present application.

BRIEF DESCRIPTION OF THE DRAWINGS

To describe technical solutions in the embodiments of the present application more clearly, drawings that needs to be used in description of the embodiments will be introduced briefly below. Obviously, the drawings described below are merely some embodiments of the present application, and those of ordinary skill in the art can obtain other drawings according to these drawings without using any inventive skill.

DETAILED DESCRIPTION OF THE EMBODIMENTS

Figure 1:
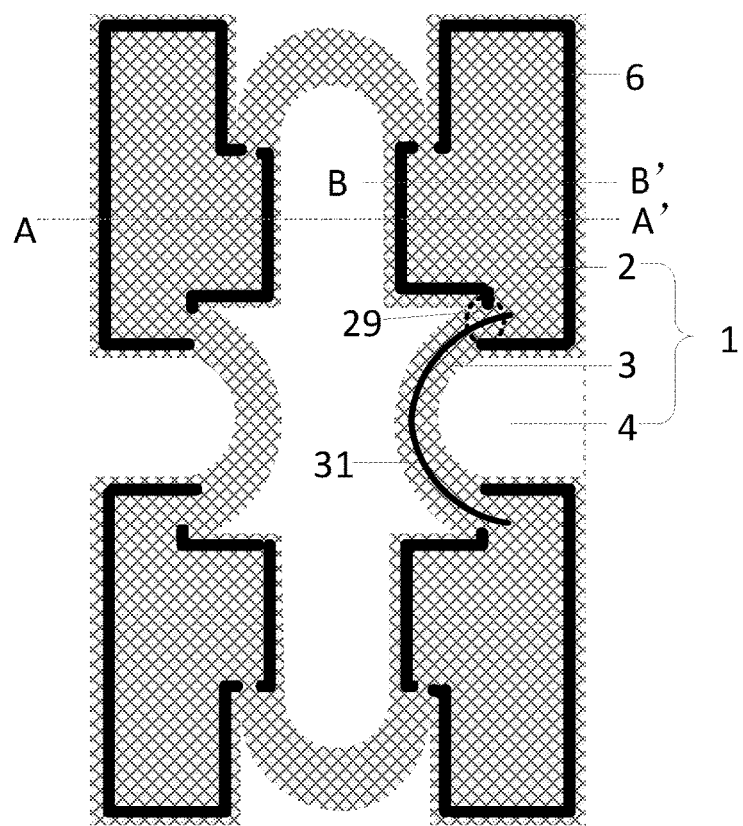
FIG. 1 is a schematic structural diagram of a flexible substrate provided in an embodiment of the present application.
Figure 2:
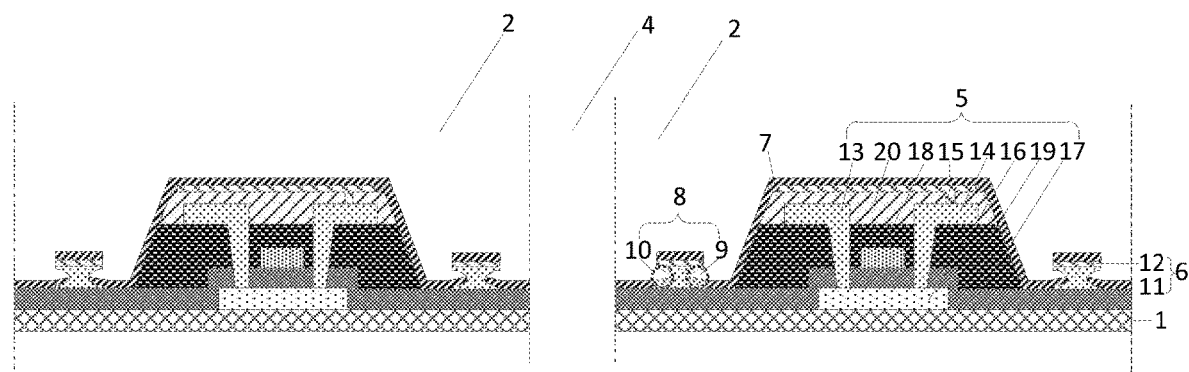
FIG. 2 is a cross-sectional view taking along AA' indicated in FIG. 1 provided in an embodiment of the present application.

An embodiment of the present application provides a flexible substrate. As shown in FIGS. 1 and 2, the flexible substrate includes a base substrate 1. The base substrate 1 has a plurality of sub-pixel areas 2 arranged in an array, and connections area 3 between the sub-pixel areas 2, each for connecting adjacent sub-pixel areas 2, and hollow areas 4 are provided on the base substrate 1 between the sub-pixel areas 2 except for the connection area 3. A cross sectional view taking along AA' indicated in FIG. 1 is shown in FIG. 2.

In each sub-pixel area 2, there are a pixel circuit 5, an isolation structure 6 surrounding the pixel circuit 5, and a light-emitting functional layer 7 covering the pixel circuit 5 and the isolation structure 6.

The isolation structure 6 has a hollow pattern 29 at a junction of the sub-pixel area 2 and the connection area 3. The connection area 3 has a signal line 31 therein, and the signal line 31 is electrically connected with the pixel circuit 5 through the hollow pattern 29.

The isolation structure 6 has an undercut 8 that interrupts the light-emitting functional layer 7.

The flexible substrate provided in the embodiment of the present application is provided with an isolation structure surrounding the pixel circuit, and the isolation structure has an undercut that interrupts the light-emitting functional layer, thereby preventing water intrusion to a pixel circuit area from edges of sub-pixels through the light-emitting functional layer, and blocking moisture intrusion so that packaging reliability may be increased, and thus the device yield and the display effect may be improved.

In some embodiments, the undercut includes: a first undercut on a side of the isolation structure facing the pixel circuit, and/or a second undercut on a side of the isolation structure facing away from the pixel circuit.

Figure 3:
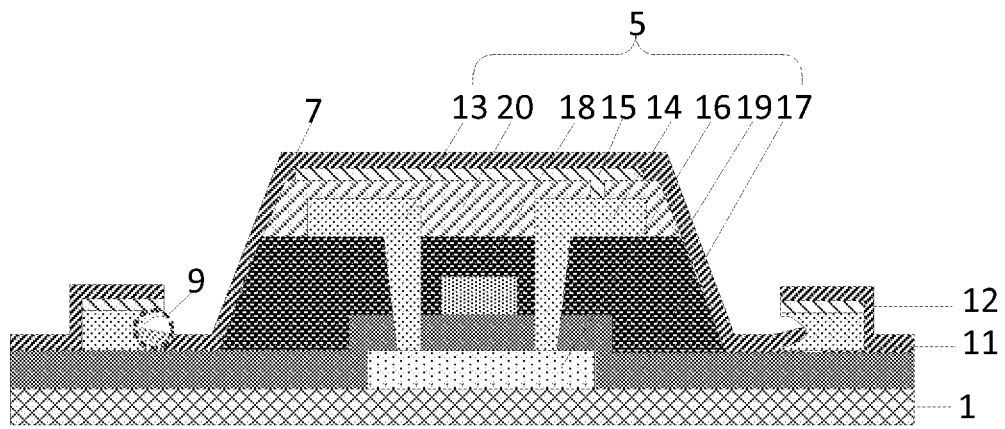
FIG. 3 is a schematic structural diagram of another flexible substrate provided in an embodiment of the present application.
Figure 4:
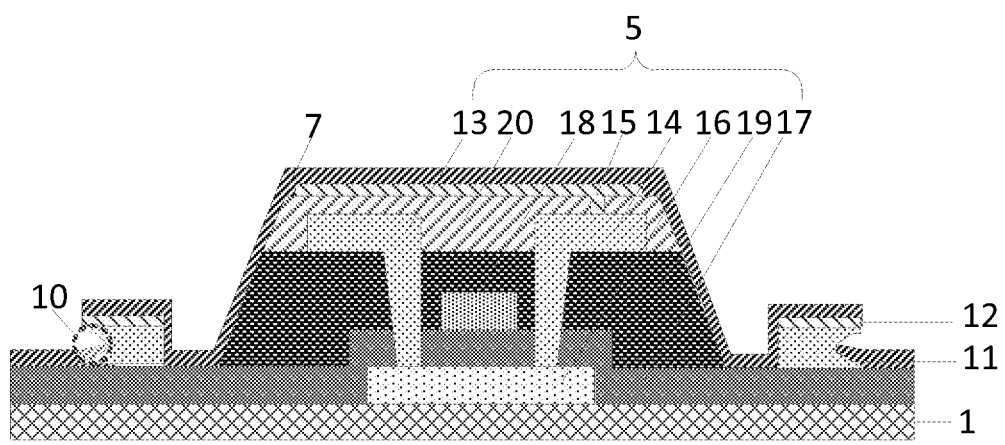
FIG. 4 is a schematic structural diagram of yet another flexible substrate provided in an embodiment of the present application.

The undercut 8 in FIG. 2 includes a first undercut 9 and a second undercut 10, and the light-emitting functional layer 7 is interrupted at the first undercut 9 and the second undercut 10 to prevent water intrusion to the pixel circuit area from edges of sub-pixels through the light-emitting functional layer 7. Of course, only providing the first undercut or the second undercut may also prevent water intrusion to the pixel circuit area. For example, as shown in FIG. 3, the undercut includes a first undercut 9 on the side of the isolation structure 6 facing the pixel circuit 5, and the light-emitting functional layer 7 is interrupted at the first undercut 9. Alternatively, as shown in FIG. 4, the undercut includes a second undercut 10 on a side of the isolation structure 6 facing away from the pixel circuit 5, and the light-emitting functional layer 7 is interrupted at the second undercut 10. FIGS. 3 and 4 are cross-sectional views taking along BB' indicated in FIG. 1.

In some embodiments, the isolation structure includes a plurality of film layers disposed in stack, where the width of at least part of an intermediate film layer is smaller than that of an upper film layer. The 'upper film layer' is a film layer relatively far from the substrate.

In some embodiments, the isolation structure includes a multi-layer metal layer and a transparent conductive layer disposed in stack successively, where the width of an intermediate layer of the multi-layer metal layer is the smallest.

Therefore, the width of the intermediate layer of the multi-layer metal layer is smaller than that of the upper film layer, to form an undercut on a side of the isolation structure. An orthographic projection of the undercut area on the substrate is covered by an orthographic projection of the upper surface of the isolation structure on the substrate, so that the light-emitting functional layer may be interrupted at the undercut to prevent water intrusion to the pixel circuit area from edges of sub-pixels through the light-emitting functional layer.

In the flexible substrate shown in FIGS. 2 to 4 provided in the embodiment of the present application, the isolation structure 6 includes a multi-layer metal layer 11 and a transparent conductive layer 12 disposed in stack successively; and the width of an intermediate layer of the multi-layer metal layer is the smallest.

Figure 5:
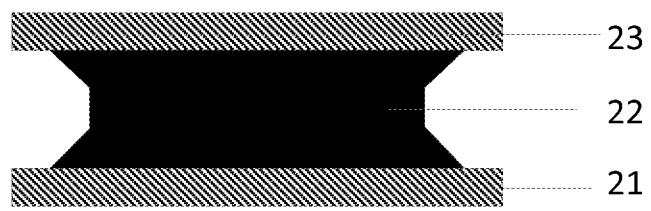
FIG. 5 is a schematic diagram of an isolation structure provided in an embodiment of the present application.

Using an undercut including a first undercut and a second undercut, and a multi-layer metal layer including three film layers as an example, as shown in FIG. 5, the multi-layer metal layer 11 include a first film layer 21, a second film layer 22 and a third film layer 23. The width of the second film layer 22 is the smallest, and the width of the second film layer 22 is smaller than the width of the third film layer 23, to form an undercut on a side of the isolation structure. An orthographic projection of the undercut area on the substrate is covered by an orthographic projection of the upper surface of the isolation structure on the substrate, so that the light-emitting functional layer may be interrupted at the undercut to prevent water intrusion to the pixel circuit area from edges of sub-pixels through the light-emitting functional layer.

In some embodiments, in the flexible substrate as shown in FIGS. 2 to 4 provided in the embodiment of the present application, the multi-layer metal layer 11 is disposed in the same layer as a source 13 and a drain 14 of a thin film transistor in the pixel circuit 5, and the transparent conductive layer 12 is disposed in the same layer as an anode 15 in the pixel circuit 5.

That is, in the flexible substrate provided in the embodiment of the present application, the isolation structure is formed at the same time as the formation of the pixel circuit. The isolation structure may be formed without increasing the preparation difficulty and design complexity of the flexible substrate, and moisture intrusion is avoided, so that packaging reliability may be increased, and thus the device yield and the display effect may be improved.

In the flexible substrate shown in FIGS. 2 to 4 provided in the embodiment of the present application, the pixel circuit 5 further includes: an active layer 16, a gate insulating layer 17, a gate 18, an interlayer insulating layer 19 and a planarization layer 20. Specifically, in each sub-pixel area 2, patterns of insulating layers such as the gate insulating layer 17, the interlayer insulating layer 19 and the planarization layer 20 are in an area surrounded by the isolation structure 6. The flexible substrate further includes a cathode above the light-emitting layer. The flexible substrate may further include a buffer layer above the base substrate, and the pixel circuit is disposed on the buffer layer. The gate may include a first gate and a second gate, and the gate insulating layer is provided between the first gate and the second gate. FIGS. 2 to 4 are described by using an example in which the pixel circuit includes a thin film transistor with a top-gate structure. Of course, the thin film transistor may also have a bottom-gate structure.

In some embodiments, the multi-layer metal layer is a titanium (Ti)/aluminum (Al)/titanium stacked layer.

Using a multi-layer metal layer shown in FIG. 5 as an example, the materials of the first film layer 21 and the third film layer 23 are titanium. The material of the second film layer 22 is aluminum. Of course, the multi-layer metal layer may also be made of other materials.

In some embodiments, the transparent conductive layer is an indium tin oxide (ITO)/silver (Ag)/indium tin oxide stacked layer. Of course, the transparent conductive layer may also be made of other materials.

In some embodiments, a maximum width of the isolation structure is 5-15 microns.

In some embodiments, the distance between the isolation structure and the pixel circuit is 5-10 microns.

In some embodiments, the distance between the isolation structure and an edge of the sub-pixel area is 5-10 microns.

Figure 6:
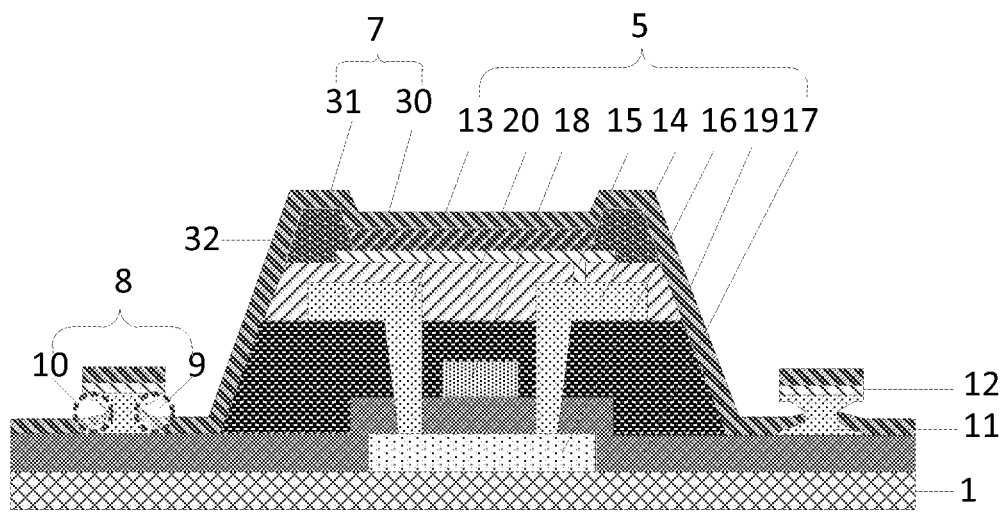
FIG. 6 is a schematic structural diagram of still yet another flexible substrate provided in an embodiment of the application.

In some embodiments, as shown in FIG. 6, the light-emitting functional layer 7 includes a light-emitting layer 30 and a cathode 31 disposed on the light-emitting layer 30, and the undercut 8 interrupts the cathode 31.

The material of the cathode is prone to suffer moisture intrusion. In the flexible substrate provided in the embodiment of the present application, the undercut of the isolation structure interrupts the cathode in the light-emitting functional layer, thereby preventing water intrusion to a pixel circuit area from edges of sub-pixels through the cathode, and blocking a moisture intrusion path, so that packaging reliability may be increased, and thus the device yield and the display effect may be improved.

In some embodiments, the material of the cathode is a magnesium-silver alloy.

In some embodiments, as shown in FIG. 6, the flexible substrate further includes a pixel definition layer 32. The pixel definition layer 32 defines a light-emitting area of each sub-pixel area, and the light-emitting layer 30 is in the light-emitting area defined by the pixel definition layer 32.

It should be noted that although a circuit of only one sub-pixel is shown in each sub-pixel area 2 in FIG. 2 of the present application, this does not mean that each sub-pixel area 2 in the present application can only have one sub-pixel. In actual design, each sub-pixel area 2 may be provided with a plurality of sub-pixels, and the specific number may be determined according to needs.

Figure 7:
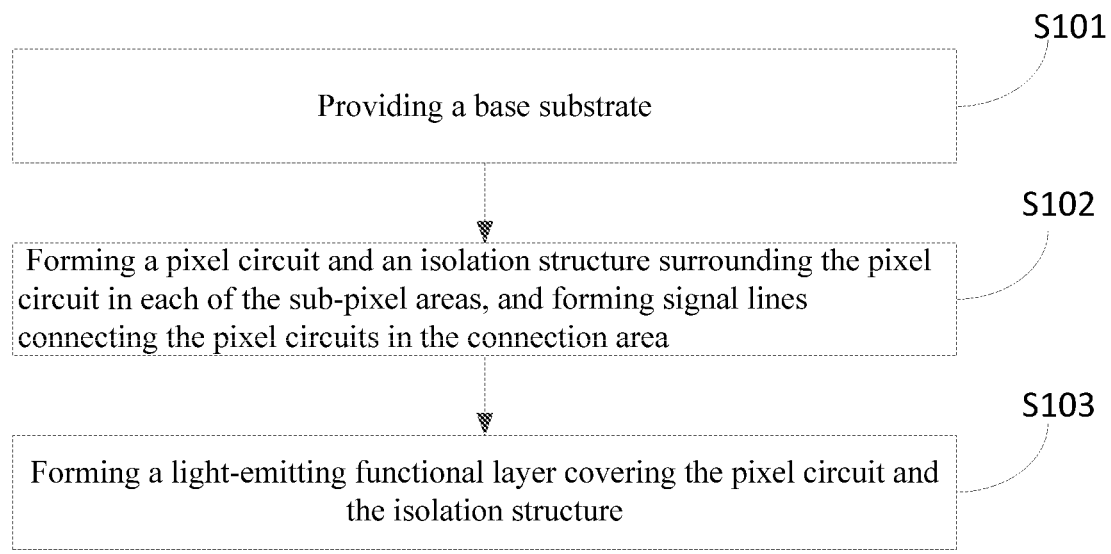
FIG. 7 is a schematic diagram of a preparation method of a flexible substrate provided in an embodiment of the application.

Based on the same inventive concept, an embodiment of the present application further provides a preparation method of a flexible substrate. As shown in FIG. 7, the method includes the following steps.

S101: providing a base substrate, where the base substrate is divided into a plurality of sub-pixel areas arranged in an array, and connection areas between the sub-pixel areas, each for connecting adjacent sub-pixel areas; and hollow areas are provided on the base substrate between the sub-pixel areas except for the connection areas.

S102, forming a pixel circuit and an isolation structure surrounding the pixel circuit in each of the sub-pixel areas, and forming signal lines connecting the pixel circuits in the connection area.

S103, forming a light-emitting functional layer covering the pixel circuit and the isolation structure.

Here the isolation structure has a hollow pattern at a junction of the sub-pixel area and the connection area; the signal line provided in the connection area is electrically connected with the pixel circuit through the hollow pattern; and the isolation structure has an undercut that interrupts the light-emitting functional layer.

In the preparation method of the flexible substrate provided in an embodiment of the present application, an isolation structure surrounding a pixel circuit is formed, and the isolation structure has an undercut that interrupts a light-emitting functional layer, thereby preventing water intrusion into a pixel circuit area from edges of sub-pixels through the light-emitting functional layer, and blocking a water intrusion path so that packaging reliability may be increased, and thus the device yield and the display effect may be improved.

Using the preparation method of the flexible substrate provided in the embodiment of the present application, forming the undercut of the isolation structure may include forming a first undercut on a side of the isolation structure facing the pixel circuit, and/or a second undercut on a side of the isolation structure facing away from the pixel circuit.

In some embodiments, the isolation structure includes a plurality of film layers disposed in stack, where the width of at least part of an intermediate film layer is smaller than that of an upper film layer.

In some embodiments, in step S102, forming a pixel circuit and an isolation structure surrounding the pixel circuit in each of the sub-pixel areas specifically includes:

forming film layers of a thin film transistor successively on the base substrate, where a multi-layer metal layer covering an encapsulation area is formed at the same time as the formation of a source and drain metal layer of the thin film transistor; here the encapsulation area is an area except for the pixel circuit, includes an area where the isolation structure is located;

forming an anode layer on the thin film transistor and the multi-layer metal layer, and forming a pattern of an anode on the thin film transistor and forming a pattern of a transparent conductive layer on the multi-layer metal layer by, using a patterning process;

forming a pattern of a multi-layer metal layer by using a patterning process, where on the base substrate, a projection of the pattern of the transparent conductive layer coincides with a projection of the pattern of the multi-layer metal layer; and forming an undercut on a side of the multi-layer metal layer facing the pixel circuit, and/or on a side of the multi-layer metal layer facing away from the pixel circuit.

In the preparation method of the flexible substrate provided in the embodiment of the present application, the isolation structure consisting of the multi-layer metal layer and the transparent conductive layer, is formed at the same time as the formation of the pixel circuit, so that the isolation structure may be formed without increasing the preparation difficulty of the flexible substrate, and moisture intrusion to a pixel circuit area from edges of sub-pixels through the light-emitting functional layer is avoided, and a moisture intrusion path is blocked so that packaging reliability may be increased, and thus the device yield and the display effect may be improved.

It should be noted that, in the case where the isolation structure includes the multi-layer metal layer in the same layer as the source and drain of the thin film transistor in the pixel circuit and the transparent conductive layer provided in the same layer as the anode in the pixel circuit, the pattern of the multi-layer metal layer and the pattern of the transparent conductive layer need to be formed in the encapsulation area. The patterning process of the multi-layer metal layer and the transparent conductive layer may include, for example, processes of photoresist coating, exposure, development, etching and the like. After the formation of the multi-layer metal layer, if the multi-layer metal layer is patterned first, and then the anode layer is formed and patterned, the processes of photoresist coating, exposure, development, etching and the like need to be carried out twice. Due to the limitation of alignment precision of an exposure machine at present, an alignment deviation is liable to occur in the patterning process carried out twice, which leads to an alignment deviation between the pattern of the multi-layer metal layer and the pattern of the transparent conductive layer, so that a side of the multi-layer metal layer is covered by the transparent conductive layer, and an undercut cannot be formed subsequently on the side. In the preparation method of the flexible substrate provided in the embodiment of the present application, after the multi-layer metal layer is formed in the encapsulation area, the multi-layer metal layer in the encapsulation area is not patterned. Rather, after the anode layer is formed, the anode layer is patterned first, then the pattern of the transparent conductive layer is formed on the multi-layer metal layer, and the multi-layer metal layer is patterned with the pattern of the transparent conductive layer as a reference. That is, the formation is achieved by self-alignment between the pattern of the multi-layer metal layer and the pattern of the transparent conductive layer, so that an alignment deviation between the pattern of the multi-layer metal layer and the pattern of the transparent conductive layer may be avoided, thereby avoiding failure to form an undercut, ensuring the product yield and improving the packaging effect.

Of course, in the case where the alignment accuracy in the patterning process can meet the requirement, it is also possible to pattern the multi-layer metal layer first, and then form the anode layer and pattern the anode.

In some embodiments, forming a pattern of an anode on the thin film transistor and forming a pattern of a transparent conductive layer on the multi-layer metal layer by using a patterning process includes:

forming a pattern of an anode on the thin film transistor and forming a pattern of a transparent conductive layer on the multi-layer metal layer by using a wet etching process; and forming a pattern of a multi-layer metal layer by using a patterning process includes: forming a pattern of a multi-layer metal layer by using a dry etching process.

In some embodiments, forming an undercut on a side of the multi-layer metal layer facing the pixel circuit, and/or on a side of the multi-layer metal layer facing away from the pixel circuit specifically includes: etching an intermediate layer of the multi-layer metal layer by a wet etching process, to form an undercut on a side of the multi-layer metal layer facing the pixel circuit, and/or on a side of the multi-layer metal layer facing away from the pixel circuit. That is, the width of the intermediate layer of the multi-layer metal layer is the smallest.

The multi-layer metal layer and the source-drain metal layer are arranged in the same layer and have the same material. Using a Ti/Al/Ti stacked structure of the multi-layer metal layer as an example, the metal Al in the intermediate layer of the multi-layer metal layer may be etched by an etchant for wet etching, and Ti remains, so that an undercut may be formed.

In the preparation method of the flexible substrate provided in the embodiment of the present application, an etchant for etching to form the transparent conductive layer may be used for etching the intermediate layer of the multi-layer metal layer during a wet etching process. That is, by using the preparation method of the flexible substrate provided in the embodiment of the present application, the isolation structure with an undercut may be formed without adding additional processes.

In some embodiments, the light-emitting functional layer includes a light-emitting layer and a cathode dispose on the light-emitting layer; and step S103 of forming a light-emitting functional layer covering the pixel circuit and the isolation structure includes:

forming a light-emitting layer on the pixel circuit; and forming a cathode covering the light-emitting layer and the isolation structure, where the undercut interrupts the cathode.

In some embodiments, before forming a light-emitting functional layer covering the pixel circuit and the isolation structure, the method further includes forming a pixel definition layer.

Figure 8:
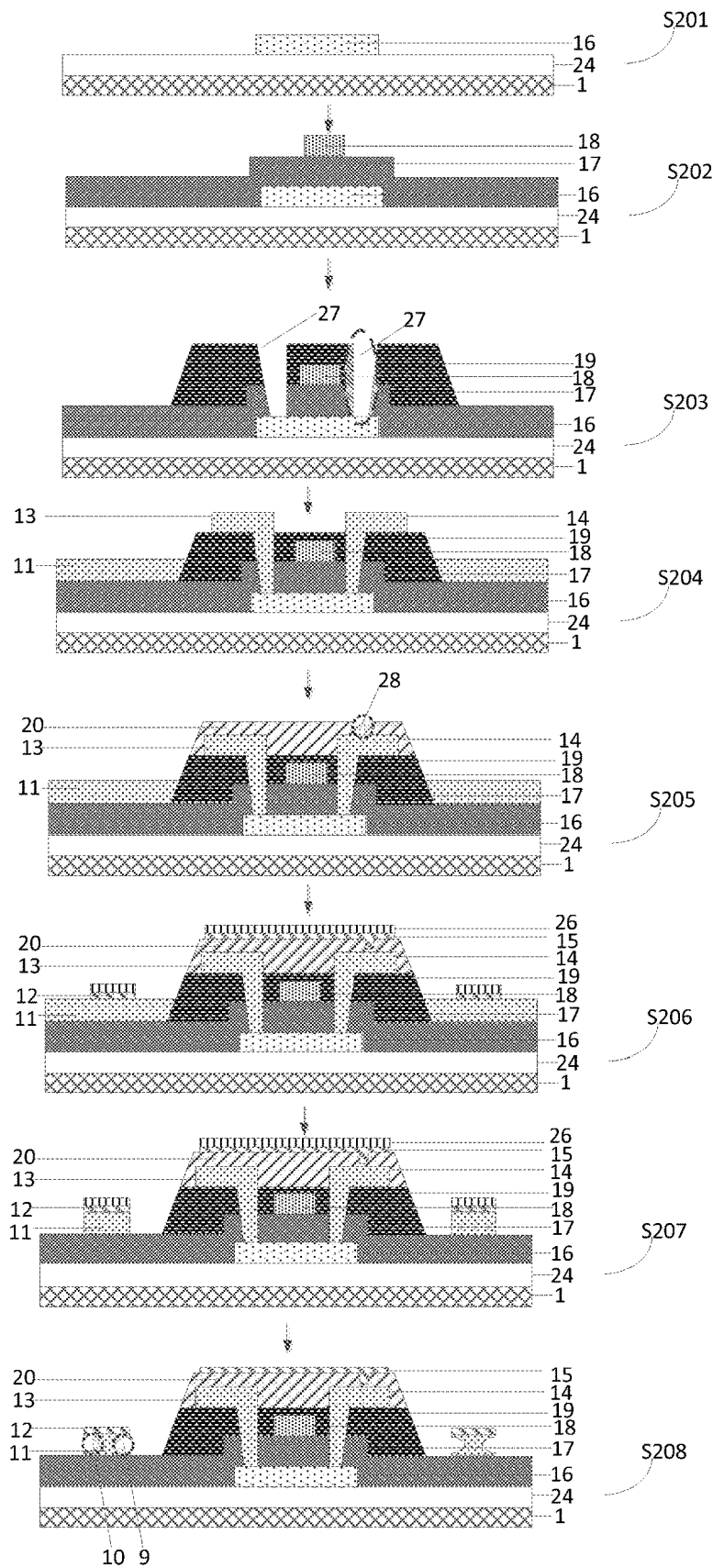
FIG. 8 is another preparation method of a flexible substrate provided in an embodiment of the present application.

Next, using the formation of a pixel circuit and an isolation structure in a sub-pixel area as an example, the preparation method of the flexible substrate provided in the embodiment of the present application will be described exemplarily. As shown in FIG. 8, the reparation method of the flexible substrate includes the following steps.

S201: forming patterns of a buffer layer 24 and an active layer 16 on a base substrate 1.

The buffer layer may be, for example, a stacked layer of silicon nitride (SiNx) and silicon oxide (SiO2). The thickness of the buffer layer is 1000-5000 angstroms. The material of the active layer may be, for example, p-Si, and the thickness of the active layer is 200-1000 Angstroms.

S202: forming a gate insulating layer 17 on the active layer 16, and forming a pattern of the gate 18 on the gate insulating layer 17.

The gate insulating layer 17 serves as a first gate insulating layer, and a pattern of a first gate can be formed on the gate insulating layer 17; a second gate insulating layer can be formed on the first gate, and a pattern of a second gate can be formed on the second gate insulating layer. The first gate insulating layer and the second gate insulating layer may be, for example, a stacked layer of SiNx and SiO2, and the thickness of the first gate insulating layer and the second gate insulating layer is 1000-5000 angstroms. The material of the first gate and the second gate may be, for example, metal film layers of molybdenum (Mo), aluminum (Al), titanium (Ti), copper (Cu), and the like, and the thickness of the first gate and the second gate is 1000-5000 Angstroms.

S203: forming an interlayer insulating layer 19 on the gate 18.

After forming the interlayer insulating layer, the pixel circuit area is patterned to form via holes 27, and the material of the encapsulation area is completely exposed and removed. The interlayer insulating layer may be, for example, a stacked layer of SiNx and SiO2, and the thickness of the interlayer insulating layer is 3000-8000 angstroms.

S204: forming a source 13, a drain 14, and a multi-layer metal layer 11 covering the encapsulation area.

The source, the drain and the multi-layer metal layer adopt a Ti/Al/Ti stacked structure, and the thickness of the source, the drain and the multi-layer metal layer is 5000-10000 Angstroms.

S205: forming a planarization layer 20.

The material of the planarization layer is resin glue. After formation of a layer of resin glue, the pixel circuit area and the encapsulation area are patterned respectively. Here the pixel circuit area is patterned to form a via hole 28, and the material of the encapsulation area is fully exposed and removed.

S206: depositing an anode material to form an anode layer, coating a photoresist 26 on the anode layer, and performing exposure, development, and etching processes to form a pattern of the anode 15 and a pattern of the transparent conductive layer 12.

The structure of the anode layer is an ITO/Ag/ITO stacked layer, and the total thickness of the anode layer is 1000-5000 Angstroms; and the etching process is wet etching.

S207: with the pattern of the transparent conductive layer 12 as a reference, performing a dry etching process on the multi-layer metal layer 11 to form a pattern of the multi-layer metal layer.

S208: etching the multi-layer metal layer 11 by using an etchant for etching the anode layer, to form a first undercut 9 on a side of the multi-layer metal layer 11 facing the pixel circuit, and form a second undercut 10 on a side of the multi-layer metal layer 11 facing away from the pixel circuit, and removing the photoresist.

Specifically, the etchant etches Al in the Ti/Al/Ti stacked structure, and Ti is retained, thereby forming the undercuts.

After step S208, a pixel definition layer, a light-emitting layer, and a cathode covering the light-emitting layer, the pixel definition layer and the isolation structure are successively formed. The first undercut and the second undercut interrupt the cathode, thereby preventing water intrusion to a pixel circuit area from edges of sub-pixels through the cathode, and blocking water intrusion path so that packaging reliability may be increased, and thus the device yield and the display effect may be improved.

A display device provided in an embodiment of the present application includes the above-mentioned flexible substrate provided in an embodiment of the present application.

The display device provided in the embodiment of the present application may be a flexible stretchable display device.

In summary, in the flexible substrate, the preparation method thereof, and the display device provided in the embodiments of the present application, an isolation structure surrounding a pixel circuit is provided, and the isolation structure has an undercut that interrupts a light-emitting functional layer, thereby preventing water intrusion to a pixel circuit area from edges of sub-pixels through the light-emitting functional layer, and blocking a water vapor invading path so that packaging reliability may be increased, and thus the device yield and the display effect may be improved.

Apparently, those skilled in the art can make changes and modifications to the present application without departing from the spirit and scope of the present application. Thus, the present application is also intended to encompass these changes and modifications if such changes and modifications of the present application are within the scope of the claims of the present application and equivalents thereof.

The invention claimed is:

1. A flexible substrate, comprising:
a base substrate;
wherein the base substrate comprises:
a plurality of sub-pixel areas arranged in an array;
connection areas between the sub-pixel areas, wherein each of the connection areas connects adjacent sub-pixel areas; and
hollow areas among the sub-pixel areas and the connection area;
wherein in each sub-pixel area, a pixel circuit, an isolation structure surrounding the pixel circuit, and a light-emitting functional layer covering the pixel circuit and the isolation structure are provided;
wherein the isolation structure has a hollow pattern at a junction of a sub-pixel area and a connection area; each of the connection areas is provided with a signal line therein, wherein the signal line is electrically connected with the pixel circuit through the hollow pattern; and
the isolation structure has an undercut that interrupts the light-emitting functional layer.

2. The flexible substrate according to claim 1, wherein the undercut comprises a first undercut on a side of the isolation structure facing the pixel circuit, and/or a second undercut on a side of the isolation structure facing away from the pixel circuit.

3. The flexible substrate according to claim 2, wherein the isolation structure comprises a plurality of film layers disposed in stack, wherein a width of at least part of an intermediate film layer is smaller than that of an upper film layer.

4. The flexible substrate according to claim 3, wherein the isolation structure comprises a multi-layer metal layer and a transparent conductive layer disposed in stack successively, wherein a width of an intermediate layer of the multi-layer metal layer is smallest.

5. The flexible substrate according to claim 4, wherein the multi-layer metal layer is disposed in a same layer as a source and a drain of a thin film transistor in the pixel circuit, and the transparent conductive layer is disposed in a same layer as an anode in the pixel circuit.

6. The flexible substrate according to claim 5, wherein the multi-layer metal layer is a titanium/aluminum/titanium stacked layer.

7. The flexible substrate according to claim 5, wherein the transparent conductive layer is an indium tin oxide/silver/indium tin oxide stacked layer.

8. The flexible substrate according to claim 1, wherein the light-emitting functional layer comprises a light-emitting layer and a cathode disposed on the light-emitting layer, and the undercut interrupts the cathode.

9. The flexible substrate according to claim 8, wherein a material of the cathode is a magnesium-silver alloy.

10. A display device comprising the flexible substrate according to claim 1.

11. A preparation method of a flexible substrate, comprising:
providing a base substrate;
wherein the base substrate comprises:
a plurality of sub-pixel areas arranged in an array;
connection areas between the sub-pixel areas, wherein each of the connection areas connects adjacent sub-pixel areas; and
hollow areas among the sub-pixel areas and the connection area
forming, in each of the sub-pixel areas, a pixel circuit and an isolation structure surrounding the pixel circuit;
forming, in each of the connection areas, a signal line connecting with the pixel circuit; and
forming a light-emitting functional layer covering the pixel circuit and the isolation structure,
wherein the isolation structure has a hollow pattern at a junction of the sub-pixel area and the connection area; the signal line in the connection area is electrically connected with the pixel circuit through the hollow pattern; and the isolation structure has an undercut that interrupts the light-emitting functional layer.

12. The method according to claim 11, wherein said that forming a pixel circuit and an isolation structure surrounding the pixel circuit in each of the sub-pixel areas comprises:
forming film layers of a thin film transistor successively on the base substrate, wherein a multi-layer metal layer covering an encapsulation area is formed at a same time as formation of a source and drain metal layer of the thin film transistor;
forming an anode layer on the thin film transistor and the multi-layer metal layer;
forming a pattern of an anode on the thin film transistor and forming a pattern of a transparent conductive layer on the multi-layer metal layer, by using a patterning process;
forming a pattern of a multi-layer metal layer by using a patterning process, wherein on the base substrate, a projection of the pattern of the transparent conductive layer coincides with a projection of the pattern of the multi-layer metal layer; and
forming an undercut on a side of the multi-layer metal layer facing the pixel circuit, and/or on a side of the multi-layer metal layer facing away from the pixel circuit.

13. The method according to claim 12, wherein said that forming a pattern of an anode on the thin film transistor and forming a pattern of a transparent conductive layer on the multi-layer metal layer by using a patterning process comprises:
forming the pattern of the anode on the thin film transistor and forming the pattern of the transparent conductive layer on the multi-layer metal layer by using a wet etching process; and
wherein said that forming the pattern of the multi-layer metal layer by using a patterning process comprises:
forming the pattern of the multi-layer metal layer by using a dry etching process.

14. The method according to claim 12, wherein said that forming an undercut on the side of the multi-layer metal layer facing the pixel circuit, and/or on the side of the multi-layer metal layer facing away from the pixel circuit comprises:
etching an intermediate layer of the multi-layer metal layer by a wet etching process, to form an undercut on the side of the multi-layer metal layer facing the pixel circuit, and/or on the side of the multi-layer metal layer facing away from the pixel circuit.

15. The method of claim 11, wherein the light-emitting functional layer comprises a light-emitting layer and a cathode disposed on the light-emitting layer; and said that forming a light-emitting functional layer covering the pixel circuit and the isolation structure comprises:
forming the light-emitting layer on the pixel circuit; and
forming the cathode covering the light-emitting layer and the isolation structure, wherein the undercut interrupts the cathode.

* * * * *